United States Patent [19]

Lieberman et al.

[11] 3,857,107

[45] Dec. 24, 1974

[54] DIGITAL COUNTER FREQUENCY CONTROL SYSTEM

[76] Inventors: Stuart I. Lieberman; Theodore H. Hopp, 1407 Chilton Dr., both of Silver Spring, Md. 20904

[22] Filed: June 19, 1973

[21] Appl. No.: 371,430

[52] U.S. Cl. ........ 331/1 A, 235/92 FQ, 235/92 CT, 235/92 R

[51] Int. Cl. .............................................. H03b 3/04

[58] Field of Search ...... 235/92 FQ, 92 CA, 92 DE, 235/92 CT, 92 EC; 324/78 D; 340/347 CC; 331/1 A, 14

[56] References Cited

UNITED STATES PATENTS

| | | | |
|---|---|---|---|
| 3,185,938 | 5/1965 | Pelosi | 331/1 A |
| 3,265,867 | 8/1966 | Venn et al. | 235/92 CA |
| 3,488,605 | 1/1970 | Schwartz | 331/1 A |

*Primary Examiner*—Gareth D. Shaw
*Assistant Examiner*—Joseph M. Thesz, Jr.
*Attorney, Agent, or Firm*—Saul Elbaum

[57] ABSTRACT

A novel technique and apparatus for stabilizing the frequency of a controllable oscillator is disclosed. The output frequency of the oscillator is periodically sampled and the sampled signal is counted during a first sampling period, the sampled count being stored. During a subsequent sampling period, the oscillator output pulses are counted once again, this subsequent sampled count being compared with the first sampled count. An error signal is generated representative of any difference noted between the first sampled count and the subsequent sampled count, this error signal being applied to the controllable oscillator so as to set the output frequency thereof. The frequency correction technique continues throughout the operation of the oscillator during successive sampling periods.

4 Claims, 1 Drawing Figure

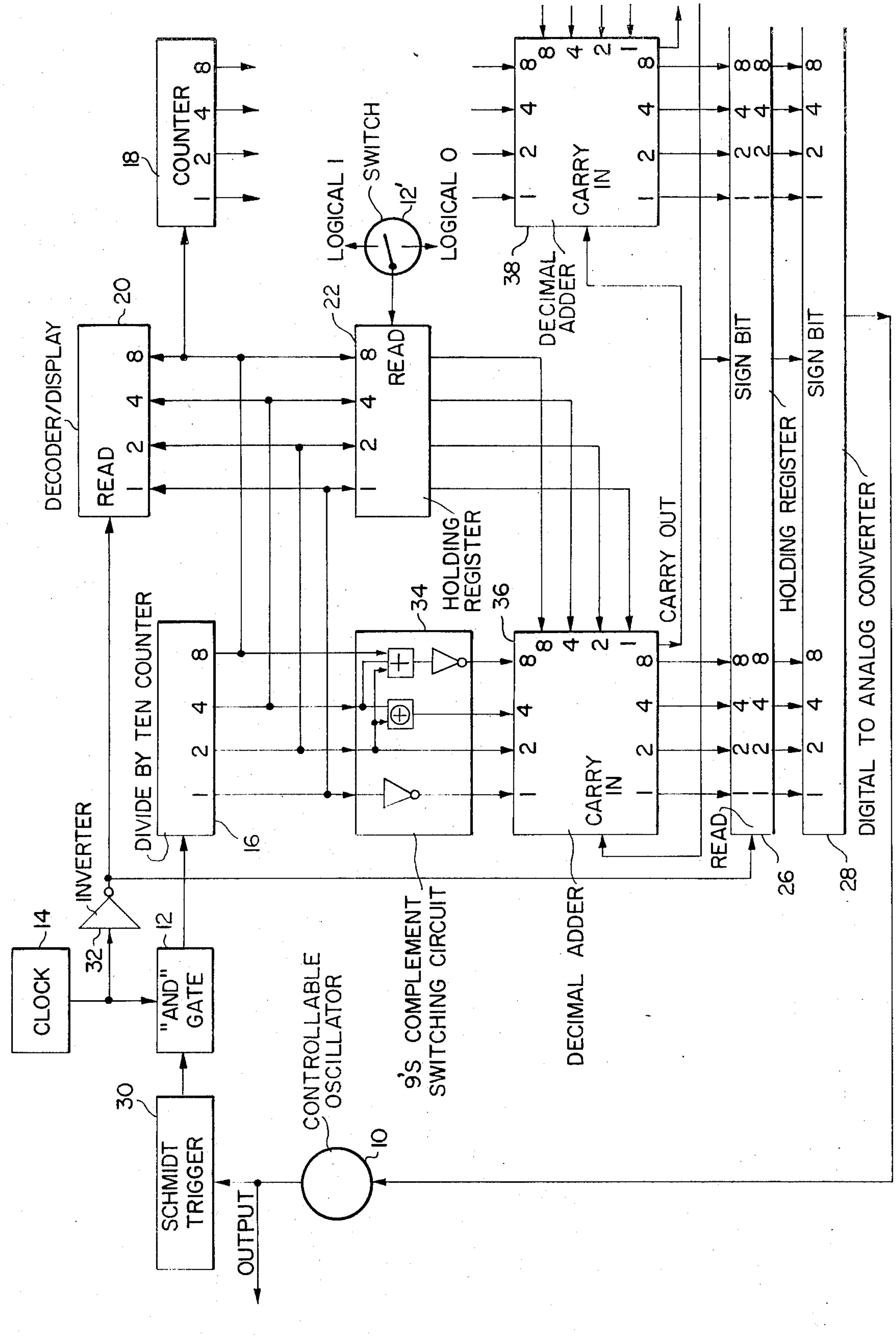
CLOCK
"AND" GATE
SCHMIDT TRIGGER
OUTPUT
CONTROLLABLE OSCILLATOR
INVERTER
DIVIDE BY TEN COUNTER
DECODER/DISPLAY
READ
COUNTER
LOGICAL I
SWITCH
LOGICAL O
HOLDING REGISTER
9'S COMPLEMENT SWITCHING CIRCUIT
DECIMAL ADDER
CARRY IN
CARRY OUT
SIGN BIT
DIGITAL TO ANALOG CONVERTER

DIGITAL COUNTER FREQUENCY CONTROL SYSTEM

The invention described herein may be manufactured, used, and licensed by or for the United States Government for governmental purposes without the payment to me of any royalties thereon.

BACKGROUND OF THE INVENTION

This invention generally relates to frequency stabilization techniques and apparatus, and particularly concerns a digital method and apparatus whereby the output frequency of a variable oscillator can be set and controlled.

In many electronic fields, a requirement exists for highly stable, yet adjustable, frequency sources such as controllable oscillators. Typical of prior art approaches to the problem of variable oscillator stability are approaches based upon either phase comparison methods or frequency synthesis methods.

With the phase comparison technique, a second signal source comprising a reference is required to accurately generate some desired frequency which is utilized to control a variable oscillator desired to be set to the same frequency. While this technique is effective in providing a stable, though variable, oscillation source, the approach has its disadvantages from an economic standpoint in that two separate oscillators are required.

Frequency synthesis techniques, on the other hand, build a desired signal from some fundamental frequency that is generated by locking in on a harmonic of the fundamental frequency. To deviate from this harmonic, it is necessary to resort to a variable oscillator which is not locked to the harmonic. Yet, the accuracy of the system would therefore no longer be as accurate as the fundamental frequency but would have an additional source of error, due to the provision of the variable oscillator.

SUMMARY OF THE INVENTION

It is apparent that a need exists in this art for a different and innovative approach for ensuring the stability of a variable oscillator. The primary objective of the instant invention is to provide such an improved technique and apparatus by which the requisite oscillator stability can be achieved without the attendant problems of the prior art.

It is a further objective of the instant invention to provide a technique for stabilizing the frequency of a controllable oscillator, which technique utilizes digital technology and which technique does not require the provision of a second signal reference source.

Yet another objective of the instant invention is the provision of a novel technique and apparatus for stabilizing the frequency of a controllable oscillator, which technique is effective over a wide range of frequencies to ensure accurate control of a variable oscillator.

These objects, as well as other objects which will become apparent as the description proceeds, are implemented by the instant invention which, from a broad and conceptual standpoint, compares the output of a variable oscillator with the past output of the same oscillator so as to detect deviations in operation and so as to generate a control signal ensuring oscillator stability.

In the preferred inventive embodiment, the output pulses from the controllable oscillator are sampled during a first sample period, the number of output pulses so sampled being counted and this count being stored. During a subsequent sample period, the number of oscillator output pulses generated are again counted, the subsequent sample count being compared with the stored first sampled count, and an error signal being generated representative of the difference between the first sampled count and the subsequent sampled count. This error signal is supplied to the controllable oscillator such that the output frequency of the oscillator is stabilized or set.

The technique of the instant invention affords the opportunity for continuous setting of the oscillator output frequency during each periodic sampling interval in that each immediately preceding count is stored while the next count is being taken, each stored count being successively compared with the new count. Thus, the "reference" count is continuously up-dated and oscillator control is continuously effected.

From the standpoint of hardware contemplated to carry out this novel technique, the instant inventive apparatus preferably utilizes a sampling means which serves to periodically sample the output frequency of the controllable oscillator and a counter means for counting the sampled signal during each successive sampling period. A storage circuit is provided for storing an immediately preceding count of the counter while the counter is counting the sampled signal during a next given period. A comparator means is provided for successively comparing each count within the counter means with each count stored in the storage circuit, the comparator means generating an error signal representative of any compared difference, this error signal being applied to the oscillator as a control signal therefor so as to set and stabilize the oscillator frequency.

A display or read-out means is also provided such that the oscillator output frequency is displayed during each successive sampling period. The frequency control circuitry is contemplated to utilize digital technology, all as will be set forth in more detail hereinbelow.

BRIEF DESCRIPTION OF THE DRAWINGS

The invention itself will be better understood, and further features and advantages thereof will become apparent, from the following detailed description of a preferred inventive embodiment, such description making reference to the appended sheet of drawing, wherein:

The FIGURE is an electrical schematic block diagram.

DETAILED DESCRIPTION OF A PREFERRED INVENTIVE EMBODIMENT

With the embodiment of the Figure, the output from the controllable oscillator 10 is first fed to a Schmidt trigger 30 which transforms the oscillator output into a square wave compatible with the subsequent digital circuitry. The output of the Schmidt trigger, a digital signal of frequency identical with the output of the controllable oscillator 10, is fed to an AND gate 12 which is also fed by the master clock 14. When the clock output is high, i.e., a logical 1, the AND gate 12 passes the output of the Schmidt trigger 30 to the first counter stage 16. When the output of the clock 14 is low, i.e., a logical 0, the output of the Schmidt trigger 30 is blocked by AND gate 12 and cannot reach the counter 16.

The output of divide-by-10 counter 16 is similarly passed to a decoder/display unit 20 where the digit corresponding to the count in counter 16 is displayed. The decoder/display unit 20 is gated by the output of the clock through an inverter 32 so that it preserves the last count on the display until a new count has been completed. The output of the counter 16 further passes to a holding register 22, this register having as its output the last count present at its input when a logical 1 was present at the READ input of register 7 as generated by switch 12.

The output of the counter 16 also is passed to a switching circuit 34 which generates as its output the 9's complement of its input, the output of switching circuit 34 being passed to a decimal adder 36 which also receives as its input the output from holding register 22.

In addition, the second and subsequent stage decimal adders (identified by reference numeral 38) has an input the carry bit from the previous decimal adder stage. The first decimal adder stage 36 has as its carry input the carry bit from the last stage (non-illustrated) of the counter chain. The output of the decimal adder 36 is the sum of the output of the divide-by-10 counter 16, plus a carry bit. If the carry bit from the final stage (the most significant digit) is used as a sign bit as well as the carry input bit to the first stage adder, then the output of the adders from all of the stages, when taken together, represent the decimal difference between the stored count represented by the output of holding register 22 and the present count represented by the output of the divide-by-10 counter 16. This difference is positive (sign bit constitutes a logical 1) if the stored count is greater than the present count, and has a negative sign (sign bit constitutes a logical 0) if the opposite is true. If the sign is negative, the difference represented by the output of all the adders will be in 9's complement.

The output of all the decimal adders 36, 38, etc., along with the sign bit is passed to a holding register 26 as one decimal number. Holding register 26 is tied to the clock 14 through the inverter 32 so as to hold the previous difference until a new count is complete and a new difference count has been obtained.

The output of the holding register 26 goes to a digital-to-analog converter 28 that translates the digital difference signal into a corresponding analog correction voltage of the proper polarity to be applied to oscillator 10 so as to complete the feedback loop that stabilize the oscillator 10.

Switch 12' performs the following function: When the switch is in the logical 0 position, holding register 22 preserves the count at its output indefinitely. The present count is compared to the stored count, and the error signal fed to the oscillator is proportional to the difference between the oscillator frequency and the frequency represented by the count within the holding register 22.

On the other hand, when the switch 12' is in the logical 1 position, the output of holding register 22 follows the output of counter 16, and the difference signal is always zero. This function is needed in order to change the oscillator frequency.

As should now be appreciated, the objectives set forth at the outset of this specification have been successfully achieved, a frequency stabilization technique having been developed which utilizes the past history of an oscillator to control its present generated output. It should be understood, however, that the invention is not to be limited to the exact details discussed in the preferred inventive embodiments, for obvious modifications will occur to persons skilled in the art.

What is claimed is:

1. An automatic frequency control system for a controllable oscillator, said system comprising:

sampling means for periodically sampling the output frequency of the oscillator and for generating a sampled signal representative of the oscillator output frequency during the current sampling period;

counter means for counting the current sampled signal during each successive sampling period;

storage circuit means for storing the immediately preceding count of said counter means representative of the oscillator output frequency during the immediately preceding sampling period while said counter means is counting the current sampled signal during the next successively sampling period;

comparator means for successively comparing each current count within said counter means with each preceding count stored in said storage circuit means and for generating an error signal representative of any compared difference during each sampling period; and means for applying said error signal to the oscillator as a control signal therefor, whereby the oscillator frequency is set and stabilized.

2. A system as defined in claim 1, wherein said sampling means further converts the oscillator output into a digital sampled signal, wherein said counter means comprises a binary counter chain, and wherein said storage means comprises a digital storage register.

3. A system as defined in claim 2, wherein said comparator means comprises a switching means having inputs coupled to the outputs of said binary counter chain for generating a signal representative of the 9's complement of the count in said binary counter chain; a decimal adder means for adding the output of said switching means and said digital storage register to thereby provide an output representative of the difference between the signals from said switching means and said digital storage register, a hold register connected to the outupt of said adder means, and wherein said error signal applying means comprises a digital-to-analog converter having an input connected to said hold register and an output adapted to be coupled to the oscillator for applying a voltage thereto to correct its frequency.

4. A method of stabilizing the frequency of a controllable oscillator, said method comprising the steps of:

periodically sampling the output frequency of the oscillator and generating a sampled signal representative of the oscillator output frequency during the current sampling period;

counting the current sampled signal during each successive sampling period;

storing the immediately preceding count representative of the oscillator output frequency during the immediately preceding sampling period while counting the current sampled signal during the next succeeding sampling period;

successively comparing each current count with each preceding stored count and generating an error signal representative of any compared difference during each sampling period; and aplying the error signal to the controllable oscillator whereby the output frequency of the oscillator is set in response to the error signal.

* * * * *